United States Patent
Hao et al.

(10) Patent No.: US 8,110,857 B2
(45) Date of Patent: Feb. 7, 2012

(54) LOW NOISE JFET

(75) Inventors: Pinghai Hao, Plano, TX (US); Imran Khan, Richardson, TX (US); Joe Trogolo, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 170 days.

(21) Appl. No.: 12/713,866

(22) Filed: Feb. 26, 2010

(65) Prior Publication Data
US 2010/0155789 A1   Jun. 24, 2010

Related U.S. Application Data

(62) Division of application No. 11/733,816, filed on Apr. 11, 2007, now Pat. No. 7,670,888.

(51) Int. Cl.
*H01L 29/66* (2006.01)

(52) U.S. Cl. .......... 257/272; 257/256; 257/E29.31; 257/E29.312

(58) Field of Classification Search .......... 257/272, 257/256, E29.31, E29.312
See application file for complete search history.

(56) References Cited

U.S. PATENT DOCUMENTS

| | | | |
|---|---|---|---|
| 4,214,215 A | 7/1980 | Mellen et al. | |
| 4,393,575 A | 7/1983 | Dunkley et al. | |
| 4,423,490 A | 12/1983 | Roesner | |
| 5,068,705 A | 11/1991 | Tran | |
| 5,296,409 A | 3/1994 | Merrill et al. | |
| 5,378,642 A | 1/1995 | Brown et al. | |
| 6,541,825 B2 | 4/2003 | Kuroi et al. | |
| 6,861,303 B2 | 3/2005 | Hao et al. | |
| 2005/0067631 A1 | 3/2005 | Pendharker et al. | |

FOREIGN PATENT DOCUMENTS
JP   06-314699   11/1994

*Primary Examiner* — Stephen W Smoot
*Assistant Examiner* — Vicki B Booker
(74) *Attorney, Agent, or Firm* — Warren L. Franz; Wade J. Brady, III; Frederick J. Telecky, Jr.

(57) ABSTRACT

A low noise (1/f) junction field effect transistor (JFET) is disclosed, wherein multiple implants push a conduction path of the transistor away from the surface of a layer upon which the transistor is formed. In this manner, current flow in the conduction path is less likely to be disturbed by defects that may exist at the surface of the layer, thereby mitigating (1/f) noise.

19 Claims, 9 Drawing Sheets

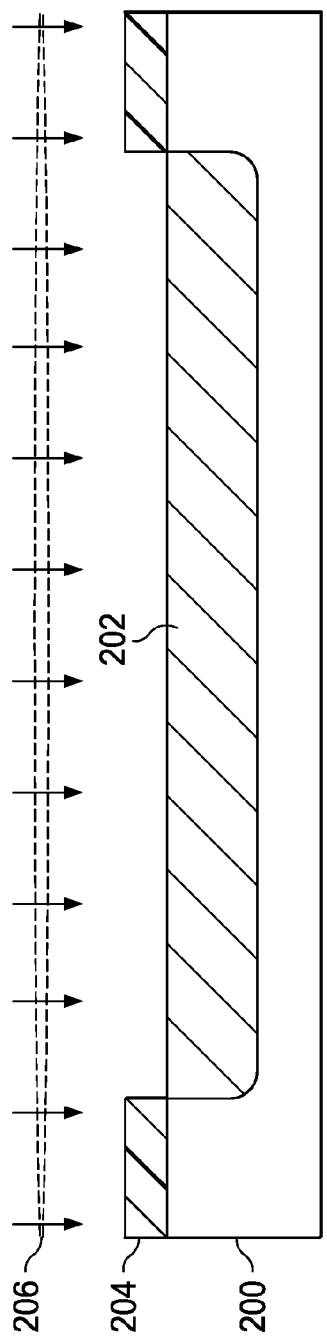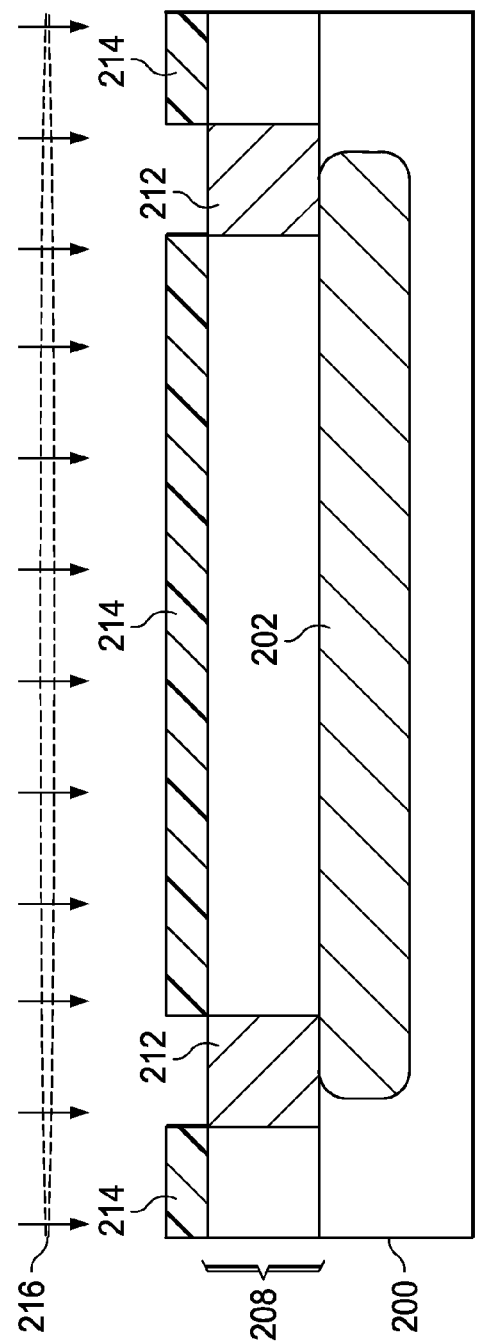

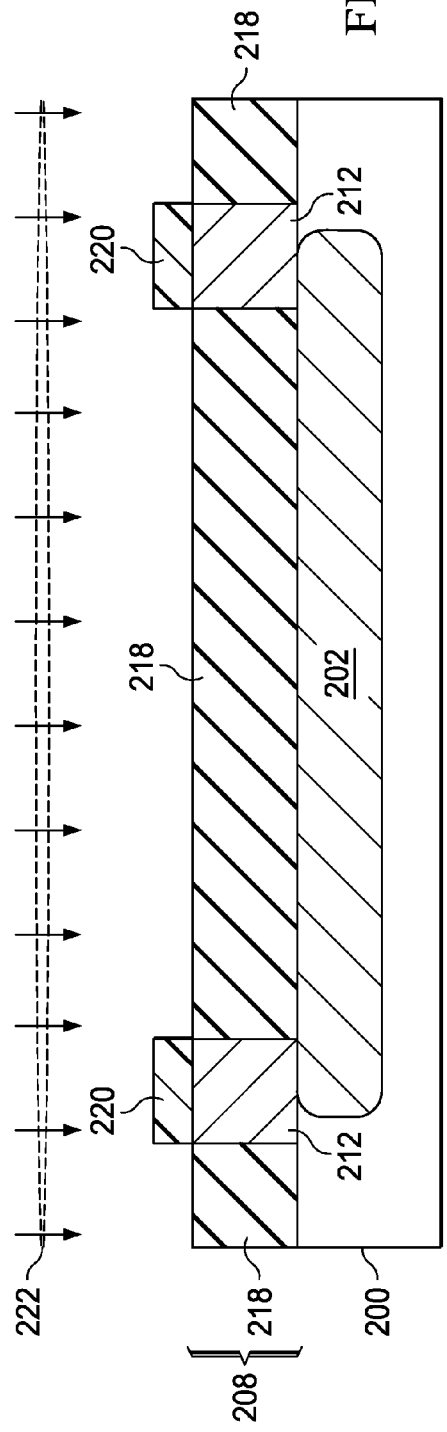
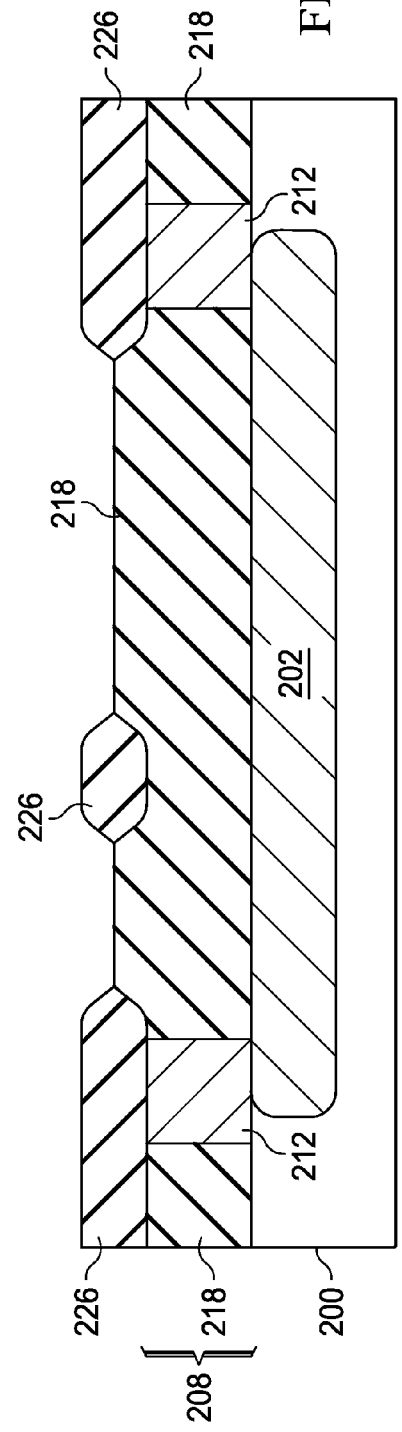

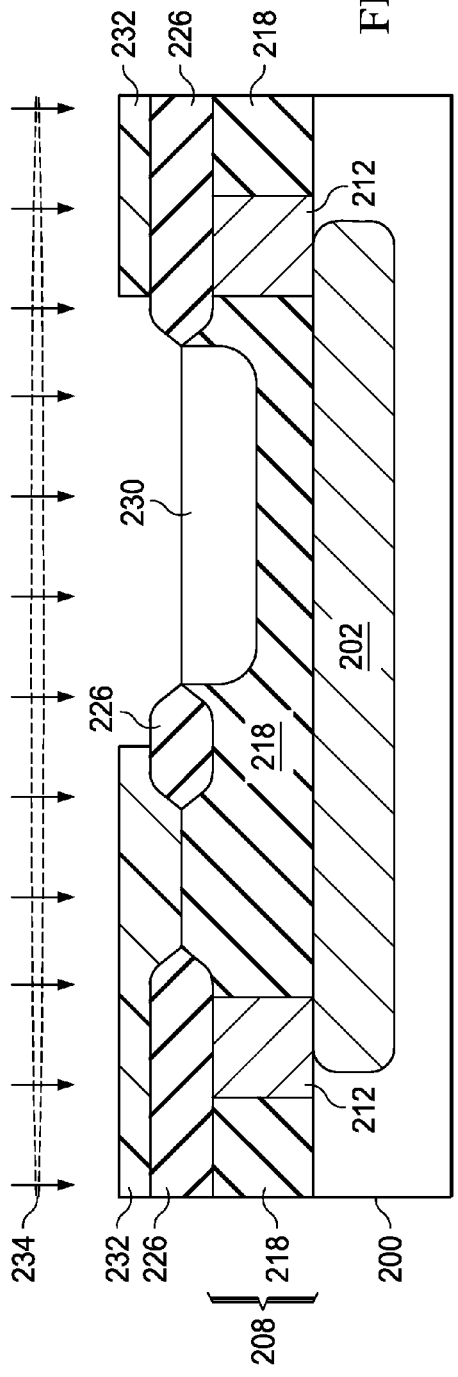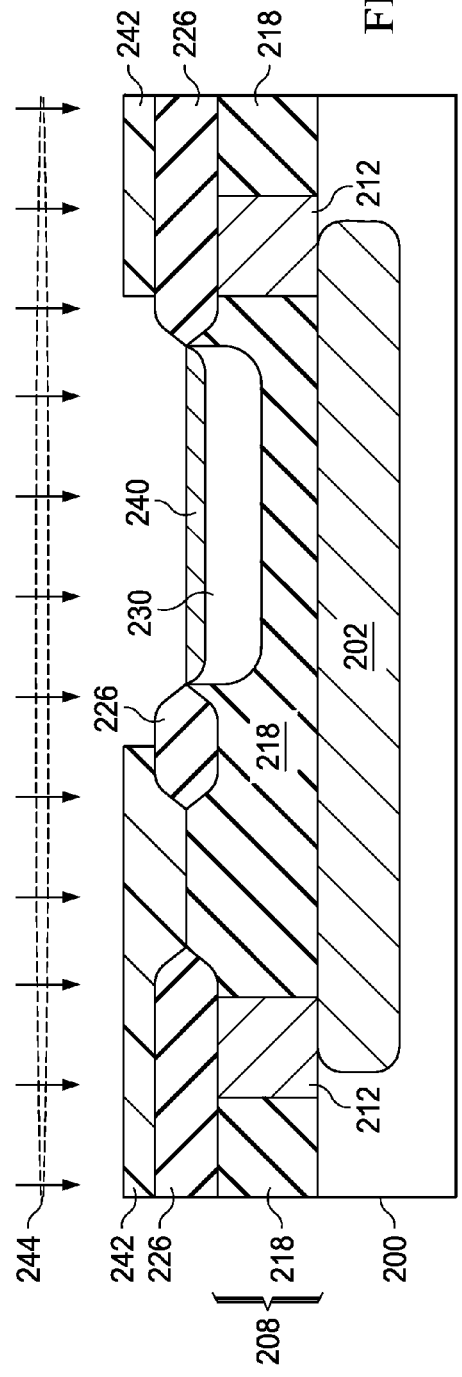

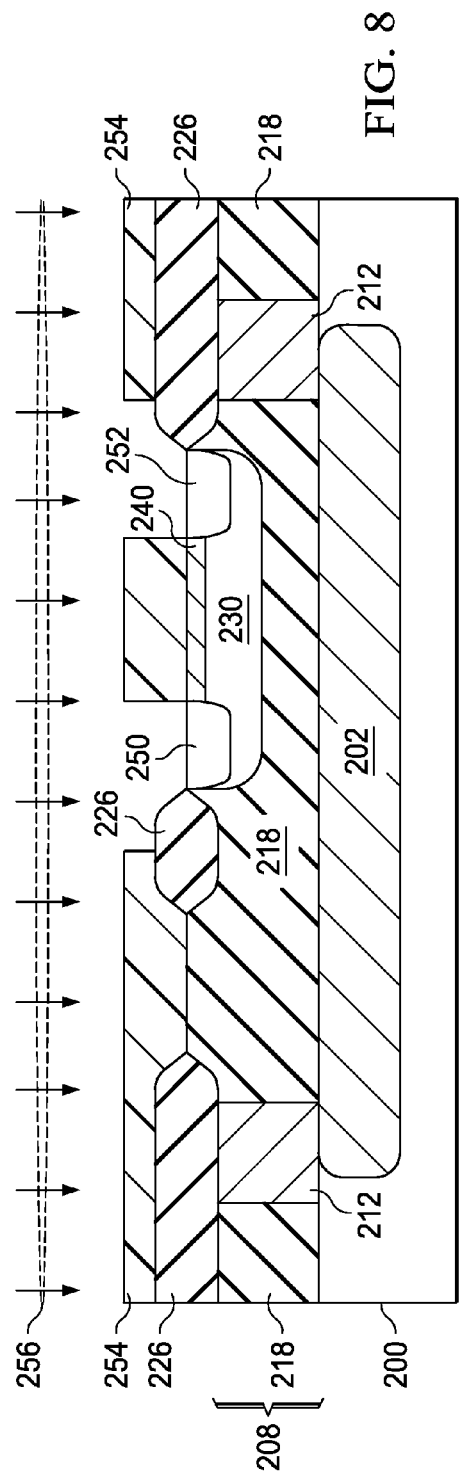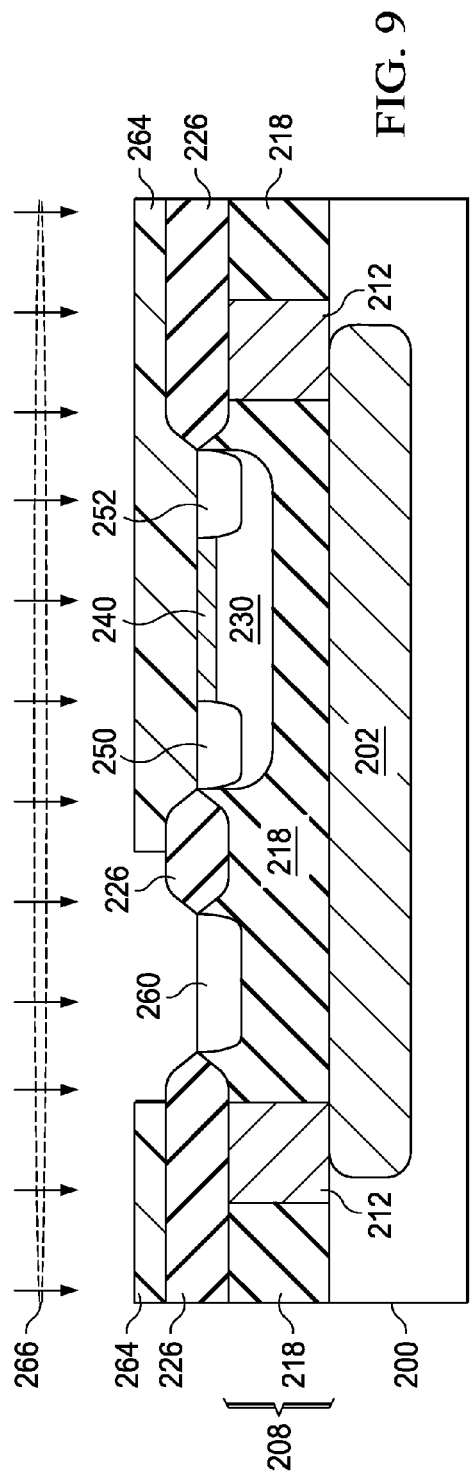

LOW NOISE JFET

This is a division of U.S. application Ser. No. 11/733,816, filed Apr. 11, 2007, the entirety of which is incorporated herein by reference.

BACKGROUND

The disclosure herein relates generally to semiconductor processing, and more particularly to fashioning a low noise junction field effect transistor (JFET). It can be appreciated that different electronic devices may have different requirements depending upon a particular device's application. For example, high performance precision analog applications may require very low noise, simple yet precise component matching, high speed and long term matching stability. In addition to demanding low component noise and precise component matching, precision analog products also require that operations of critical components be reliable and not modulated by other undesired sources such as overlying conducting metal buses. It would, therefore, be desirable to fashion transistors that operate with low noise, good matching and high disturbance immunity characteristics.

It can also be appreciated that transistors are basic building blocks of semiconductor circuitry and electronic devices. Accordingly, the type of transistor used depends upon the applications and the characteristics of the transistor. For example, junction field effect transistors (JFETs) generally exhibit very low 1/f noise and high input impedance. Complementary metal oxide semiconductor (CMOS) transistors, on the other hand, operate with a relatively higher level of noise and have a high impedance or low input current. Bipolar transistors, in contrast, accommodate good matching and, low noise, but exhibit a low impedance or a high input current. Given the desire for low noise in high performance precision analog applications and the propensity for JFET transistors to operate with low noise, it would thus be desirable to produce a JFET in a cost effective manner that allows the JFET to operate with even lower noise so that the JFET can be implemented in a high performance precision analog application.

SUMMARY

The following presents a summary to provide a basic understanding of one or more aspects of the disclosure herein. This summary is not an extensive overview. It is intended neither to identify key or critical elements nor to delineate scope of the disclosure herein. Rather, its primary purpose is merely to present one or more aspects in a simplified form as a prelude to a more detailed description that is presented later.

Fashioning a low noise (1/f) junction field effect transistor (JFET) is disclosed, where multiple implants are performed to push a conduction path of the transistor away from the surface of a layer upon which the transistor is formed. In this manner, current flow in the conduction path is less likely to be disturbed by defects that may exist at the surface of the layer, thereby mitigating (1/f) noise.

To the accomplishment of the foregoing and related ends, the following description and annexed drawings set forth certain illustrative aspects. Other aspects, advantages and/or features may, however, become apparent from the following detailed description when considered in conjunction with the annexed drawings.

BRIEF DESCRIPTION OF THE DRAWINGS

FIGS. 2-10 are cross-sectional views of a semiconductor substrate wherein an exemplary low noise JFET is formed.

DETAILED DESCRIPTION

Figure 1:
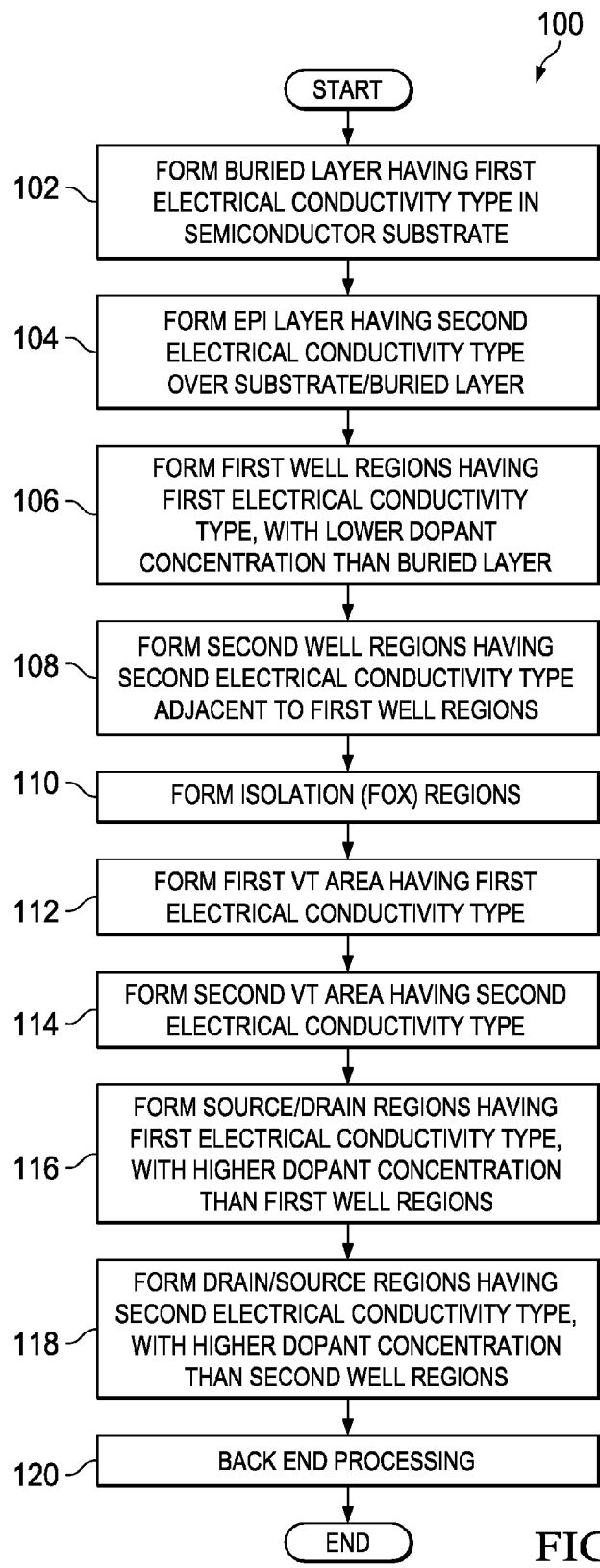
FIG. 1 is a flow diagram illustrating an exemplary methodology for forming a low noise junction field effect transistor (JFET).

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

An exemplary methodology 100 for forming a low noise (1/f) junction field effect transistor (JFET) is illustrated in FIG. 1, and FIGS. 2-14 are views of a semiconductor substrate 200 wherein such a method is implemented. While the method 100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases.

At the outset, a buried layer or a back or bottom gate (BG) region 202 having a first electrical conductivity type (e.g., n or p type) is formed in the semiconductor substrate 200 at 102 (FIG. 2). The BG 202 can be formed, for example, by forming and patterning a first resist 204 over the substrate 200 and performing a first (selective) implantation 206 of one or more dopants into the substrate 200. It will be appreciated that substrate as referred to herein may comprise any type of semiconductor body (e.g., silicon, SiGe, SOI) such as a semiconductor wafer or one or more die on a wafer, as well as any other type of semiconductor and/or epitaxial layers formed thereon and/or otherwise associated therewith. It will also be appreciated that the patterning of the first resist 204 (as with all masking and/or patterning mentioned herein) can be performed in any suitable manner, such as with lithographic techniques, for example, where lithography broadly refers to processes for transferring one or more patterns between various media. In lithography, a light sensitive resist coating (e.g., 204) is formed over one or more layers to which a pattern is to be transferred. The resist coating is then patterned by exposing it to one or more types of radiation or light which (selectively) passes through an intervening lithography mask containing the pattern. The light causes exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., doped).

At 104, an epitaxial or EPI layer 208 having a second electrical conductivity type (e.g., p or n type) is formed (e.g., grown) over the surface of the substrate 200 (FIG. 3). At 106, first well regions 212 having the first electrical conductivity type are (selectively) formed within the EPI layer 208 down to the BG 202 (FIG. 3). The first well regions 212 may be formed, for example, with a second patterned resist 214 and a second implantation 216. The first well regions 212 are typically formed to have a dopant concentration that is lower than the dopant concentration of the BG 202.

Second well regions 218 having the second electrical conductivity type are then (selectively) formed within the EPI layer 208 adjacent to the first well regions 212 at 108 (FIG. 4). The second well regions 218 may be formed, for example, with a third patterned resist 220 and a third implantation 222. The second well regions 218 are typically formed to have a dopant concentration that is greater than the dopant concentration of the EPI layer 208.

At 110, isolation regions 226 are formed in the EPI layer 208 to electrically isolate different active areas from one another (FIG. 5). The isolation regions 226 can comprise LOCOS (local oxidation of silicon) FOX (field oxide) regions and/or STI (shallow trench isolation) regions, for example. To implement LOCOS isolation regions, for example, a hardmask (e.g., of $Si_3N_4$) (not shown) may be formed over the EPI layer 208 and patterned so that underlying areas where the isolation regions are to be formed are exposed. Then, one or more dopants (e.g., boron) can be implanted into these exposed areas to form channel stops that mitigate the formation of inversion layers which could create undesirable conductive channels between adjacent devices. A relatively thick (e.g., around 500 nm) oxide pad (e.g., $SiO_2$) is then grown in the exposed areas, where the hardmask inhibits such growth in locations other than these areas. Due to its thickness, the oxide is formed relatively quickly by a wet growth process to keep the fabrication process timely. The hardmask is then removed, leaving the LOCOS or FOX isolation regions 226.

A first threshold voltage (Vt) region 230 having the first electrical conductivity type is formed in the EPI layer 208 at 112 (FIG. 6). The first Vt region 230 may be formed, for example, with a fourth patterned resist 232 and a fourth implantation 234. It can be appreciated that the implanted dopants constituting region 230 are self-aligned with the isolation regions 226. Accordingly, if the resist 232 happens to be pulled back, the first Vt region 230 will still be positioned as desired because of the self-alignment with the isolation regions 226. The first Vt region 230 is typically formed to have a dopant concentration that is greater than the dopant concentration of the first well regions 212. In one example, the first Vt region 230 is formed to a depth of between about 0.5 um and about 1.5 um, for example.

Also, as will be appreciated, forming the low (1/f) noise transistor as described herein can be done as part of/concurrently with a CMOS fabrication process, thus allowing the JFET to be to be produced in a cost effective manner. That is, acts necessary to form the JFET can be "borrowed" from the CMOS flow. In this manner, the low noise JFET can be fabricated as part of a CMOS process flow without having to modify the CMOS flow (or otherwise develop a special flow for the JFET). Accordingly, region 230 is referred to as a (first) threshold voltage (Vt) region because the (fourth) implantation 234 used to form it may correspond to a threshold voltage (Vt) implantation that is performed as part of a CMOS fabrication process.

A second threshold voltage (Vt) region 240 having the second electrical conductivity type is then formed over the first threshold voltage region 230 at 114 (FIG. 7). The second Vt region 240 may be formed, for example, with a fifth patterned resist 242 and a fifth implantation 244. As with region 230, the implanted dopants constituting region 240 are self-aligned with the isolation regions 226, thus being somewhat independent of the patterning of the fifth resist 242. The second Vt region 240 is typically formed to have a dopant concentration that is greater than the dopant concentration of the second well regions 218. In any event, since the second Vt region 240 is formed over/within the first Vt region 230, the second Vt region 240 has a concentration of second electrical conductivity type (e.g., p or n type) dopants that is sufficient to overpower/overcome the concentration of first electrical conductivity type (e.g., n or p type) dopants of the first Vt region 230 in this area of the EPI layer 208. In one example, the second Vt region 240 is formed to a depth of between about 0.1 um and about 0.3 um, for example.

Similar to region 230, region 240 is referred to as a (second) threshold voltage (Vt) region because the (fifth) implantation 244 used to form it may also correspond to a threshold voltage (Vt) implantation that is performed as part of a CMOS fabrication process. Moreover, since the second Vt region 240 is formed over/within the first Vt region 230, and more particularly has the same dimensions as the first Vt region 230, the fifth patterned resist 242 used to form the second Vt region 240 may correspond to the fourth patterned resist 232 used to form the first Vt region 230. That is, the fifth patterned resist 242 and the fourth patterned resist 232 may, in fact, comprise the same resist. It can be appreciated that utilizing a single patterned resist/mask to form both the first and second Vt regions 230, 240 streamlines the fabrication process, at least, by reducing the number of patterning activities that have to be performed.

At 116, source and drain regions 250, 252 having the first electrical conductivity type are formed in a spaced apart manner over/within the first and second Vt regions 230, 240 (FIG. 8). The source and drain regions 250, 252 may be formed, for example, with a sixth patterned resist 254 and a sixth implantation 256. The source and drain regions 250, 252 are again self-aligned with at least some of the isolation regions 226, thus tolerating some variation in the patterning of the sixth resist 254. The source and drain regions 250, 252 are typically formed to have a dopant concentration that is greater than the dopant concentration of the first well regions 212. In any event, since the source and drain regions 250, 252 are formed over/within the first and second Vt regions 230, 240, the source and drain regions 250, 252 have a concentration of first electrical conductivity type (e.g., n or p type) dopants that is sufficient to overpower/overcome the concentration of second electrical conductivity type (e.g., p or n type) dopants of the second Vt region 240 as well as the concentration of first electrical conductivity type (e.g., n or p type) dopants of the first Vt region 230 in this area of the EPI layer 208. In one example, the source and drain regions 250, 252 are formed to a depth of between about 0.1 um and about 0.35 um, for example. Forming the source and drain regions to a depth that is greater than the depth of the second Vt region 240 allows the source and drain regions 250, 252 to electrically couple to the first Vt region 230.

At 118, a source or drain region 260 having the second electrical conductivity type is formed in a second well region 218 between the first well regions 212 (FIG. 9). The source or drain region 260 may be formed, for example, with a seventh patterned resist 264 and a seventh implantation 266. The source or drain region 260 is again self-aligned with at least some of the isolation regions 226, thus tolerating some variation in the patterning of the seventh resist 264. The source or drain region 260 is typically formed to have a dopant concentration that is greater than the dopant concentration of the second well region 218. It will be appreciated that the source or drain region 260 serves as a mechanism for contacting the second well region 218. In one example, the source or drain region 260 is formed to a depth of between about 0.1 um and about 0.3 um, for example.

Figure 10:
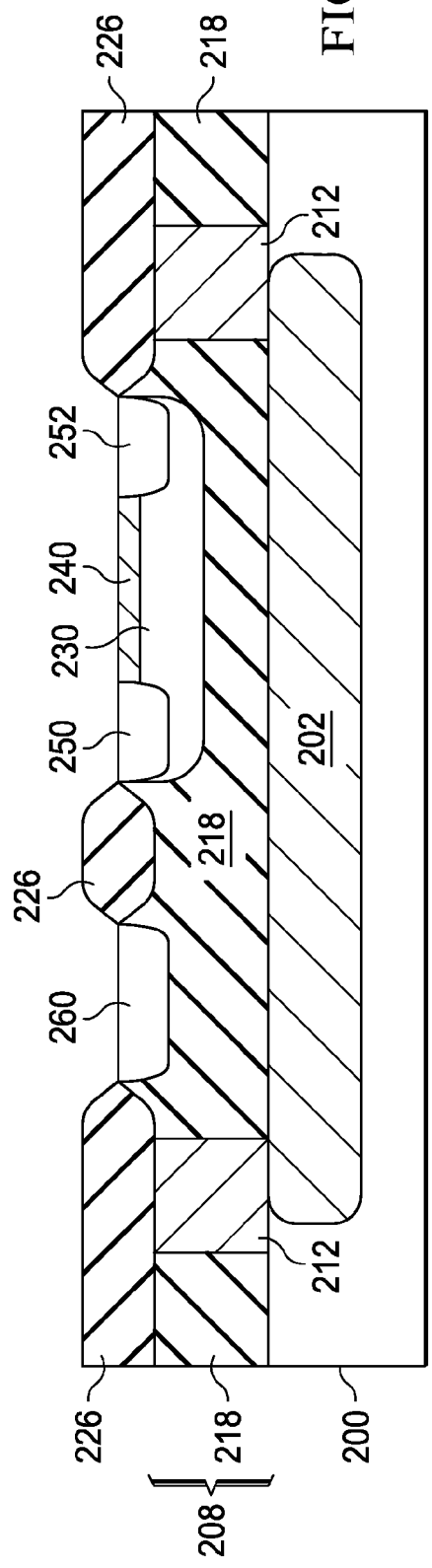
Figure 11:
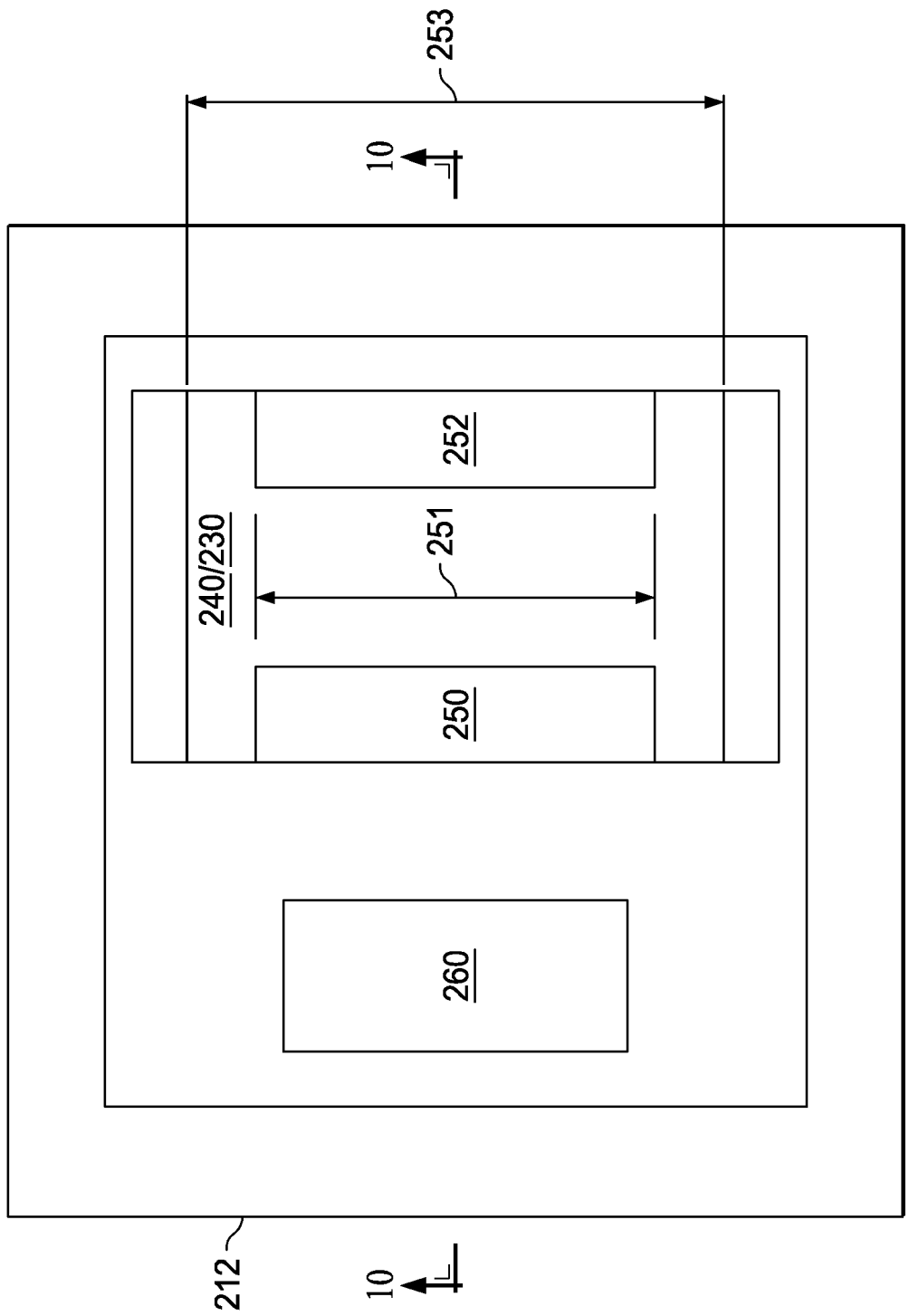
FIG. 11 is a top view of a semiconductor substrate wherein an exemplary low noise JFET is formed, where a cross section taken along lines 10-10 in FIG. 11 may correspond to the device illustrated in FIG. 10.

FIG. 10 illustrates the structure of FIG. 9 with the resist 264 removed (e.g., stripped). FIG. 11 is a top view of a the structure of FIG. 10, where a cross section taken along lines 10-10 in FIG. 11 corresponds to the device illustrated in FIG. 10. Isolation regions 226 are not depicted in FIG. 11 (or FIG. 12) for simplicity. It can be appreciated that the entire structure is isolated (e.g., by the buried layer 202 on the bottom and the first well regions 212 on all sides). It can also be appreciated that the first and second Vt regions 230, 240 extend (into and out of the page in FIG. 10) more than the source and drain regions 250, 252. That is, the source and drain regions 250, 252 have a length 251 that is less than a length 253 of the first and second Vt regions 230, 240 so that the source and drain regions 250, 252 do not overlie all of the first and second Vt regions 230, 240. This allows the second Vt region 240 to electrically couple to the second well region 218.

Figure 13:
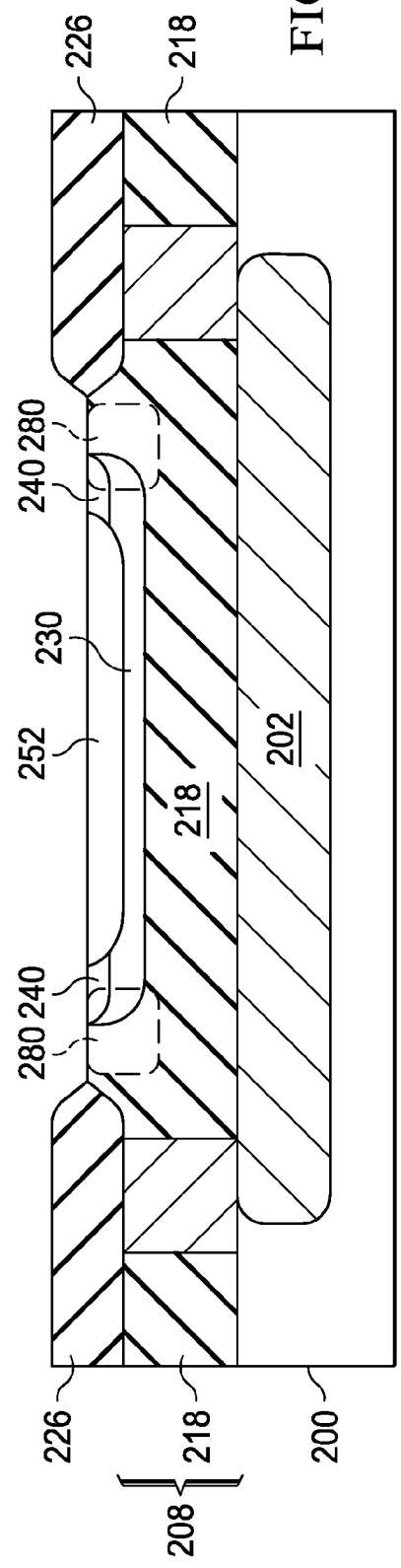
FIG. 13 is a cross-sectional view of a semiconductor substrate wherein an exemplary low noise JFET is formed.
Figure 12:
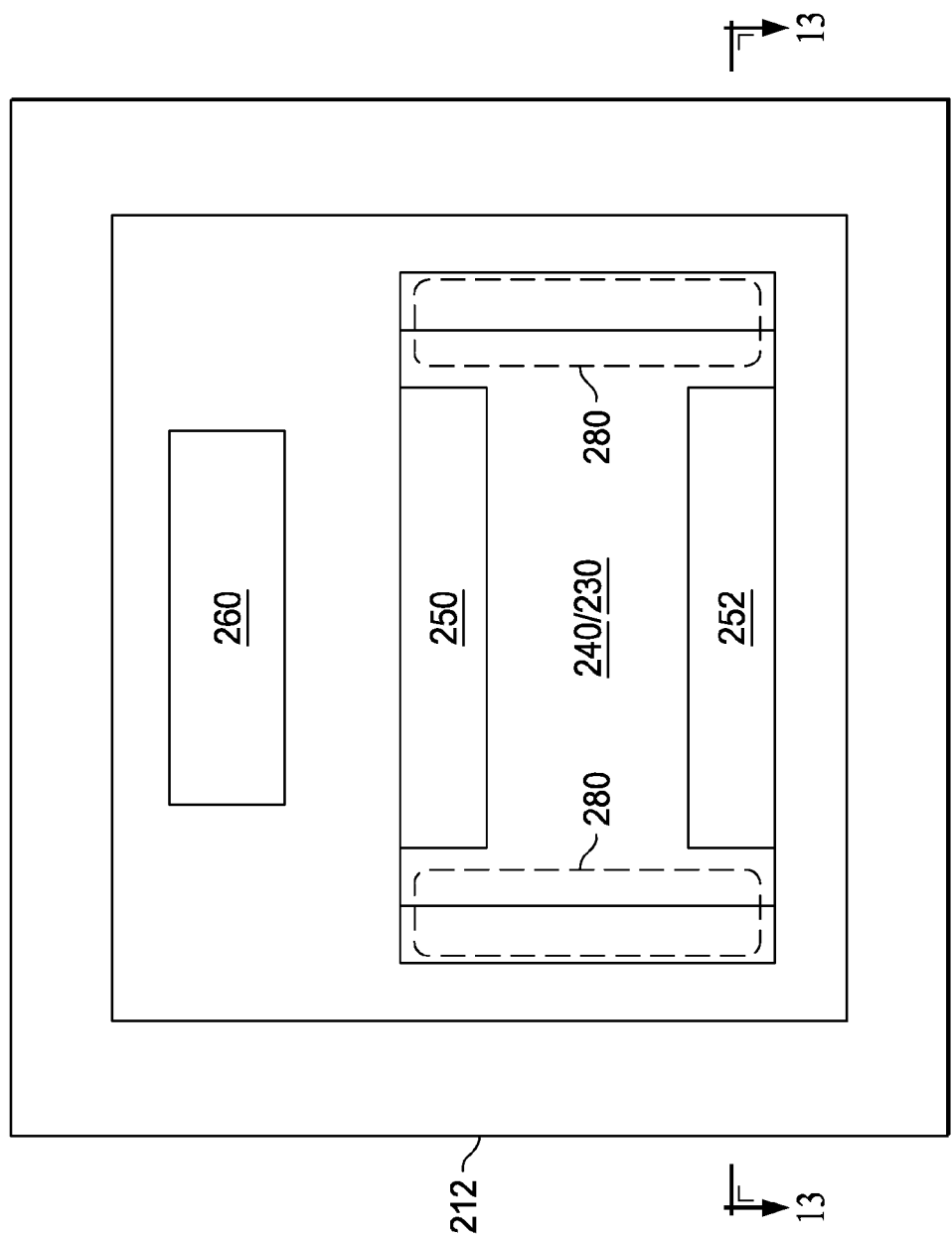
FIG. 12 is a top view of a semiconductor substrate wherein an exemplary low noise JFET is formed, where a cross section taken along lines 13-13 of FIG. 12 may correspond to the device illustrated in FIG. 13.

The ability of the second Vt region 240 to connect to the second well region 218 can be further appreciated in FIGS. 12 and 13. FIG. 12 generally corresponds to the top view presented in FIG. 11, but rotated by about ninety degrees. FIG. 13 corresponds to a cross-sectional view of FIG. 12 taken along lines 13-13. It can be seen that since the second Vt region 240 extends past the drain region 252 (and source region 250) this second Vt region 240 which has the second electrical conductivity type can couple to the second well 218 which also has the second electrical conductivity type. It will also be appreciated that the dopants implanted to form the source or drain region 260 can also be implanted into regions 280 to facilitate this coupling. More particularly, the mask 264 utilized to form the source or drain region 260 (FIG. 9) can be patterned so that the dopants implanted by the seventh implantation 266 are also implanted into regions 280. It will be appreciated that regions 280 can overlap regions 230 and 240 a little, but should not get too close to the source or drain regions 250, 252 to mitigate leakage. Establishing the regions 280 also mitigates current flow near the surface of the EPI layer 208 at the edges of regions 230 and 240, where such surface current flow is undesirable as it may promote 1/f noise.

Figure 14:
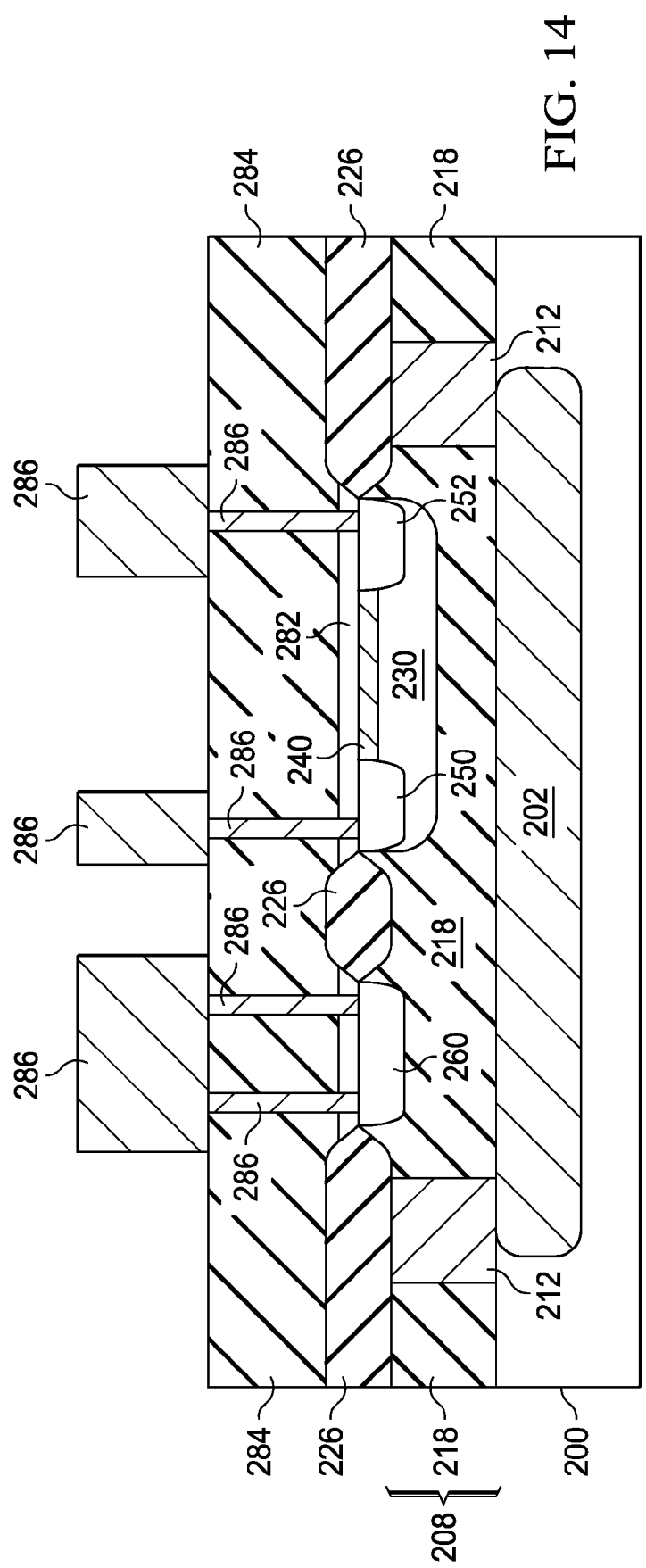
FIG. 14 is a cross-sectional view of a semiconductor substrate wherein an exemplary low noise JFET is formed.

The methodology then advances to further back end processing at 120 and ends thereafter. By way of example, one or more conductive and/or dielectric layers can be formed and/or patterned during back end processing. FIG. 14 depicts the structure of FIG. 10, for example, with a high quality thin (gate) oxide 282 over 230, 240, 250, 252 and 260. Similarly, a thicker layer of oxide based material 284 is then formed over everything and conductive contacts 286 are formed therethrough down to 250, 252 and 260.

It will be appreciated that the first and second Vt regions 230, 240 allow current to conduct between the source and drain regions 250, 252 (which have the first electrical conductivity type) through the first Vt region 230 (which also has the first electrical conductivity type). More particularly, since the second Vt region 240 has the second electrical conductivity type, carriers are significantly less prone to traverse this area, and are instead much more willing to travel through the first Vt region 230. In this manner, current flow is effectively pushed down away from the surface of the EPI layer 208. This is advantageous because defects (e.g., dangling bonds, scratches and/or other irregularities, etc.) are more likely to occur at the surface of the EPI layer 208 than at other locations, and such defects can interrupt current flow, thus leading to 1/f noise. As such, forcing the current down to where defects are less likely to occur effectively mitigates 1/f noise by promoting more regular, uninterrupted and/or uniform current flow.

As alluded to above, fashioning a JFET as described herein can be readily integrated into a standard CMOS fabrication process. For example, the first through seventh patterned resists and corresponding implantations mentioned herein can be borrowed from or implemented with existing masking and implantation actions that are part of a standard CMOS fabrication process. For example, the source and drain implantations performed at 256 and 266 may correspond to implantations performed to form source and drain regions in CMOS transistors. Similarly, regions 230, 240 are referred to as Vt regions herein because they may be formed when threshold voltage (Vt) implantations are performed in a CMOS fabrication process. Nevertheless, regions 230, 240 may be formed at any suitable time (e.g., with implantations other than threshold voltage implantations). Additionally, the illustrated ordering of acts or events disclosed herein can be varied. Fashioning a JFET as part of a standard CMOS fabrication process thus allows the JFET to be produced in a cost effective manner, which satisfies an ongoing desire in semiconductor fabrication.

While reference is made throughout this document to exemplary structures in discussing aspects of methodologies described herein (e.g., those structures presented in FIGS. 2-14 while discussing the methodology set forth in FIG. 1), those methodologies are not to be limited by the corresponding structures presented. Rather, the methodologies (and structures) are to be considered independent of one another and able to stand alone and be practiced without regard to any of the particular aspects depicted in the Figs. By way of further example, circular or race-track types structures can be fashioned in accordance with the methodology disclosed herein. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein. Further, some regions that are illustrated as having distinct or abrupt edges may not be so precisely delineated, but may instead blend slightly with other regions. This is particularly true of doped or implanted regions that may diffuse with other regions, particularly at abutting edges.

What is claimed is:

1. An integrated circuit including a junction field effect transistor (JFET), comprising:
   a buried layer having a first electrical conductivity type formed in a semiconductor substrate;
   an epitaxial layer having a second electrical conductivity type formed over the semiconductor substrate and over the buried layer;
   first well regions having the first electrical conductivity type formed in the epitaxial layer down to the buried layer;
   a second well region having the second electrical conductivity type formed within the epitaxial layer between the first well regions;
   isolation regions formed in the surface of the epitaxial layer to electrically isolate different active areas from one another;
   a first threshold voltage region having the first electrical conductivity type formed in the second well region within a first active area between first and second adjacent ones of the isolation regions;
   a second threshold voltage region having the second electrical conductivity type formed in the first threshold voltage region, the first threshold voltage region formed deeper than the second threshold voltage region; and
   a source region and a drain region having the first electrical conductivity type formed in a spaced apart relationship in the first threshold voltage region.

2. The circuit of claim 1, wherein the source region and the drain region are formed deeper than the second threshold voltage region.

3. The circuit of claim 2, further comprising a second source or drain region having the second electrical conductivity type formed in the second well region within a second active area between the first isolation region and a third one of the isolation regions adjacent the first isolation region.

4. The circuit of claim 3, wherein the source and drain regions are formed to a length that is less than a length of the first and second threshold voltage regions so that the second threshold voltage region can electrically couple to the second well region.

5. The circuit of claim 4, further comprising adding dopants within the first active area when forming the second source or drain region within the second active area; the dopants serving to facilitate the electrical coupling between the second threshold voltage region and the second well region.

6. The circuit of claim 3, further comprising forming the second threshold voltage region to be continuous between the source and drain regions.

7. The circuit of claim 2, wherein the source and drain regions are formed to a length that is less than a length of the first and second threshold voltage regions so that the second threshold voltage region can electrically couple to the second well region.

8. The circuit of claim 2, further comprising forming the first threshold voltage region to be continuous between the source and drain regions.

9. The circuit of claim 1, wherein the source and drain regions are formed to a length that is less than a length of the first and second threshold voltage regions.

10. The circuit of claim 1, wherein the second threshold voltage region is continuous from the source region to the drain region.

11. An integrated circuit including a junction field effect transistor (JFET), comprising:
    a buried layer having a first electrical conductivity type formed in a semiconductor substrate;
    an epitaxial layer having a second electrical conductivity type formed over the semiconductor substrate and over the buried layer;
    first well regions having the first electrical conductivity type formed in the epitaxial layer down to the buried layer;
    a second well region having the second electrical conductivity type formed within the epitaxial layer between the first well regions;
    isolation regions formed in the surface of the epitaxial layer to electrically isolate different active areas from one another;
    a first threshold voltage region having the first electrical conductivity type formed in the second well region in self-alignment within a first active area between first and second adjacent ones of the isolation regions;
    a second threshold voltage region having the second electrical conductivity type formed in the second well region, in a same self-alignment as the first threshold voltage region, within the first active area between the first and second isolation regions; the first threshold voltage region being formed deeper than the second threshold voltage region; and
    a source region and a drain region having the first electrical conductivity type formed in a spaced apart relationship in the first threshold voltage region;
    whereby the first and second threshold voltage regions are formed to allow current to flow between the source and the drain regions preferentially through the first threshold voltage region rather than the second threshold voltage region; thereby effectively pushing current flow below the surface of the epitaxial layer.

12. The circuit of claim 11, further comprising a second source or drain region having the second conductivity type formed in the second well region in self-alignment within a second active area between the first isolation region and a third one of the isolation regions adjacent the first isolation region.

13. The circuit of claim 12, further comprising coupling regions having the second electrical conductivity type formed in the first active area simultaneously with forming the second source or drain region; the coupling regions serving for electrically coupling the first and second threshold voltage regions to other parts of the second well region.

14. The circuit of claim 11, wherein the source and drain regions are formed to a length that is less than a length of the first and second threshold voltage regions.

15. The circuit of claim 11, further comprising coupling regions having the second electrical conductivity type formed in the first active area and overlapping the first and second threshold voltage regions, for electrically coupling the first and second threshold voltage regions to other parts of the second well region.

16. The circuit of claim 11, wherein the second threshold voltage region is formed after and within the first threshold voltage region.

17. The circuit of claim 11, wherein the first and second threshold voltage regions are formed using a same patterned mask.

18. An integrated circuit including a junction field effect transistor (JFET), comprising:
    a buried layer having a first electrical conductivity type formed in a semiconductor substrate;

an epitaxial layer having a second electrical conductivity type formed over the semiconductor substrate and over the buried layer;

first well regions having the first electrical conductivity type formed in the epitaxial layer down to the buried layer;

a second well region having the second electrical conductivity type formed within the epitaxial layer between the first well regions;

isolation regions formed in the surface of the epitaxial layer to electrically isolate different active areas from one another;

a first threshold voltage region having the first electrical conductivity type formed in the second well region within a first active area between first and second adjacent ones of the isolation regions;

a second threshold voltage region having the second electrical conductivity type formed in the first threshold voltage region using a same masking pattern as used to form the first threshold region; the first threshold voltage region being formed deeper than the second threshold voltage region;

a source region and a drain region having the first electrical conductivity type formed in a spaced apart relationship in the first and second threshold voltage regions; and a second source or drain region having the second conductivity type formed in the second well region within a second active area between the first isolation region and a third one of the isolation regions adjacent the first isolation region;

whereby the first and second threshold voltage regions are formed to allow current to flow between the source and the drain regions preferentially through the first threshold voltage region rather than the second threshold voltage region; thereby effectively pushing current flow below the surface of the epitaxial layer.

19. The circuit of claim 18, wherein the source and drain regions are formed to a length that is less that a length of the first and second threshold voltage regions; and further comprising forming coupling regions having the second electrical conductivity type in the first active area and overlapping the first and second threshold voltage regions, for electrically coupling the first and second threshold voltage regions to other parts of the second well region.

* * * * *